(12) United States Patent
Kamal

(10) Patent No.: US 10,965,315 B2
(45) Date of Patent: Mar. 30, 2021

(54) DATA COMPRESSION METHOD

(71) Applicant: Andrew Kamal, Washington Township, MI (US)

(72) Inventor: Andrew Kamal, Washington Township, MI (US)

(*) Notice: Subject to any disclaimer, the term of this patent is extended or adjusted under 35 U.S.C. 154(b) by 302 days.

(21) Appl. No.: 16/059,633

(22) Filed: Aug. 9, 2018

(65) Prior Publication Data

US 2020/0052714 A1 Feb. 13, 2020

(51) Int. Cl.
*H03M 7/30* (2006.01)
*G06F 17/18* (2006.01)
*H03M 99/00* (2006.01)

(52) U.S. Cl.
CPC .............. *H03M 7/60* (2013.01); *G06F 17/18* (2013.01); *H03M 99/00* (2013.01)

(58) Field of Classification Search
CPC .......... H03M 7/60; H03M 7/30; H03M 99/00; G06F 17/18
USPC ........................................................ 707/693
See application file for complete search history.

(56) References Cited

U.S. PATENT DOCUMENTS

| | | | |
|---|---|---|---|
| 5,272,478 A | 12/1993 | Allen | |
| 2007/0066906 A1* | 3/2007 | Goldberger | A61B 5/0456 600/509 |
| 2009/0254572 A1* | 10/2009 | Redlich | G06Q 10/06 |
| 2013/0179409 A1* | 7/2013 | Amit | H03M 7/30 707/693 |
| 2015/0055961 A1* | 2/2015 | Meyers | H04B 10/70 398/140 |
| 2015/0334405 A1* | 11/2015 | Rosewarne | H04N 19/593 375/240.02 |
| 2016/0283516 A1* | 9/2016 | Barnes | G06F 3/04883 |
| 2017/0163986 A1* | 6/2017 | Jacobson | H04N 19/593 |
| 2017/0201771 A1* | 7/2017 | Nicolas | H04N 19/186 |
| 2018/0113880 A1* | 4/2018 | Metcalf-Putnam | G06F 16/24532 |
| 2018/0137675 A1* | 5/2018 | Kwant | G06T 17/20 |
| 2019/0081637 A1* | 3/2019 | Pool | H03M 7/3079 |
| 2019/0114191 A1* | 4/2019 | Lawrence | G06F 9/455 |

* cited by examiner

*Primary Examiner* — Giovanna B Colan

(74) *Attorney, Agent, or Firm* — Carlson, Gaskey & Olds, P.C.

(57) ABSTRACT

An example method of compressing a data set includes determining whether individual values from a data set correspond to a first category or a second category of values. Based on one of the values corresponding to the first category, the value is added to a compressed data set. Based on one of the values corresponding to the second category, the value is excluded from the compressed data set, and a statistical distribution of values of the second category is updated based on the value. During a first phase, the determining is performed for a plurality of values from a first portion of the data set based on comparison of the values to criteria. During a second phase, the determining is performed for a plurality of values from a second portion of the data set based on the statistical distribution.

25 Claims, 6 Drawing Sheets

```
 31 31 31     31 31 31       32
 ↓  ↓  ↓      ↓  ↓  ↓         
00 000 3.089068 5 6 7 9.0807 8979⁻³ 12 00 13 -1 15 -18 19
            34    ³√253
2 4 5 00 10 0 11 ³√253 13 15 39.05603e⁷ 18 0 19
4 7 8 9 11 12 00 13 000 16 17 3e64 19
                                    36
00 0000 1 2 5 6 7 11 12 15 16 18
                          38
4.807 5 6 8   lim    10 12 16 17  22/7
   44    40  7→256⁷              42
3 4 7 9 10.078089e⁷ 12 15 16 17 19
2 4 6 7 000 8 9.07898 10 00 000 12 18 20.90890
1 2 5 8.984 Σ(1.034e⁷+ 256⁷) 10 13 -1.069119 17 18
                              46
1 4 5 6 7 8 9 110.923013 19 20
                              48
1 0000 2 4 5 6 8 1 00 11 1e42 13 14 19
2 00 4 6 8 10 2425 11 00 12 13 14 0 17
```

```
8979⁻³   ³√253   39.05603e⁷

3e64    lim      22/7
       7→256⁷

10.078089e⁷   Σ(1.034e⁷+ 246⁷) 1e42
```

Fig-4 mRNA [NM_002372] 6.160182863e-002

6.369597414e-001 2.907321921e-002 9.033001e+002

1.570254e+001 4123.88 79.7059 8.448096e+002 28 28

3.314357e+002 0 1 235r286e+001 3.816386e+001

2.976786e+002 2.43308e+001 295 340 31 60 3.514325e+000

3.198710e+001 6.108387e+001 0.349977 0.0635867

155 155 0 0 0 247.198 269.015 0 0

7.647217e+000 0 1 3.79062e-029 0 9.23164e-025 4.5947

0 0 0 0 3.51433 7.64722 0 1

7.21229 0 1 71.5203 4.719538342e-001 0 844.81

1 50.4801 24.6761 1 318.992 0

923.3 15.7203 91.69 91.67 280.49 341 0

DATA 391 2 176 thc|THC2167541 A_14_P119484

50.4801 THC2167541chr17:042420513-077660572

DATA COMPRESSION METHOD

BACKGROUND

This application relates to data processing, and more particularly to a method and system for efficiently compressing data sets for subsequent data processing.

Data analytics is a process of examining data sets in order to draw conclusions about the information they contain, typically with the aid of specialized systems and software. Data analytics is widely used in commercial industries to enable organizations to make more-informed business decisions, for example, by looking for patterns in data sets and/or inferences that can be made from the data sets.

Software used for analyzing large data sets, such as the commercially available software package RAPIDMINER®, typically includes a data visualization component to visualize portions of a data set and a data mining component that looks for patterns in a data set. Such software typically performs "data scrubbing" when unexpected data is encountered, such as irrational numbers (i.e., numbers that cannot be expressed as a fraction of any integers and have non-terminating decimal expansions) and complex numbers (i.e., numbers in the form a+bi, where a and b are real numbers, and i is a solution of the equation $x^2=-1$).

The data scrubbing causes the unexpected data to be omitted from the data set. This can be problematic for data sets such as particle accelerator and cancer genomics data sets, in which irrational and/or complex numbers are not extraneous or erroneous data, but rather represent some of the most significant data of interest.

SUMMARY

One example embodiment of a method of compressing a data set includes obtaining a data set and criteria for determining whether individual values from the data set correspond to a first category or a second category of values. A determination is made of whether values of the data set correspond to the first category or the second category. Based on one of the values corresponding to the first category, the value is added to a compressed data set. Based on one of the values corresponding to the second category, the value is excluded from the compressed data set, and a statistical distribution of values of the second category is updated based on the value. During a first phase, the determining is performed for a plurality of values from a first portion of the data set based on comparison of the values to the criteria. During a second phase that is subsequent to the first phase, the determining is performed for a plurality of values from a second portion of the data set that is different from the first portion based on the statistical distribution In another example embodiment of the above described method, values corresponding to the first category of data are more complex than values corresponding to the second category of data.

In another example embodiment of any of the above described methods, the method includes, during the second phase: determining a probability that a particular value from the second portion of the data set corresponds to the second category based on the statistical distribution, and determining that the particular value corresponds to the second category based on the probability exceeding a predefined threshold.

In another example embodiment of any of the above described methods, the determining of a probability that a particular value from the second portion of the data set corresponds to the second category based on the statistical distribution is performed based on Bayes' theorem.

In another example embodiment of any of the above described methods, the second phase is initiated in response to a trigger event.

In another example embodiment of any of the above described methods, each determination corresponds to an iteration, a value from the data set is only added to the statistical distribution if the value is not already present in the statistical distribution, and the trigger event includes no values from the first portion of the data set being added to the statistical distribution for a predefined quantity of consecutive iterations.

In another example embodiment of any of the above described methods, the trigger event includes completion of the determination for a predefined portion of the data set.

In another example embodiment of any of the above described methods, during the first phase, determining whether a value of the data set corresponds to the first category or the second category includes determining that the value corresponds to the first category based on the value being an irrational number.

In another example embodiment of any of the above described methods, during the first phase, determining whether a value of the data set corresponds to the first category or the second category includes determining that the value corresponds to the first category based on the value being a complex number.

In another example embodiment of any of the above described methods, during the first phase, determining whether a value of the data set corresponds to the first category or the second category includes determining that the value corresponds to the first category based on the value being a mixed hash that includes both numeric and alphabetical characters.

In another example embodiment of any of the above described methods, during the first phase, determining whether a value of the data set corresponds to the first category or the second category includes determining that the value corresponds to the first category based on the value including a non-zero decimal value at or beyond an Xth decimal place, where X is a predefined value that is greater than nine.

In another example embodiment of any of the above described methods, during the first phase, determining whether a value of the data set corresponds to the first category or the second category includes determining that the value corresponds to the second category based on the value being an integer.

In another example embodiment of any of the above described methods, updating the statistical distribution of values of the second category in the data set based on the value includes: adding the value to the statistical distribution based on the value not already being present in the statistical distribution, and updating the statistical distribution to reflect a quantity of times the value has been found in the data set based on the value already being in the statistical distribution.

In another example embodiment of any of the above described methods, the method includes, during the second phase, determining a redundancy of a particular value from the second portion of the data set within the data set, and determining that the particular value corresponds to the second category based on the redundancy exceeding a predefined threshold.

In another example embodiment of any of the above described methods, the compressed data set is stored in a quadtree data structure.

In another example embodiment of any of the above described methods, the quadtree data structure is a point quadtree data structure.

In another example embodiment of any of the above described methods, values determined to correspond to the first category during first phase are stored in a first quadrant of the quadtree data structure, and values determined to correspond to the first category during the second phase and are stored in one or more other quadrants of the quadtree data structure that are different from the first quadrant.

In another example embodiment of any of the above described methods, the quadrant in which a given value is stored in the point quadtree data structure is based on which portion of the data set the value was obtained from.

In another example embodiment of any of the above described methods, the quadtree data structure includes four quadrants, a quantum computing processor includes a plurality of qubits, each corresponding to one of the quadrants, and the determination of whether a value corresponds to the first category and should be added to a particular quadrant is performed by one or more of the qubits corresponding to the particular quadrant.

In another example embodiment of any of the above described methods, the method includes verifying that values corresponding to the second category are not present in the compressed data set based on the Riemann zeta function.

In another example embodiment of any of the above described methods, verifying that values corresponding to the second category are not present in the compressed data set based on the Riemann zeta function includes: determining a subset of values in the compressed data set that reside within a critical strip of the Riemann zeta function; verifying whether the subset of values satisfy the criteria; and based on a value from the subset not satisfying the criteria, excluding the value from the compressed data set.

One example embodiment of a quantum computer includes processing circuitry including a quantum processor having a plurality of qubits divided into four groups, each group corresponding to a quadrant of a point quadtree data structure. The processing circuitry configured to: obtain a data set and criteria for determining whether individual values from the data set correspond to a first category or a second category of values, determine whether values of the data set correspond to the first category or the second category, and based on one of the values corresponding to the first category, add the value to a compressed data set in the point quadtree data structure. The processing circuitry is configured to, based on one of the values corresponding to the second category, exclude the value from the compressed data set, and update a statistical distribution of values of the second category in the data set based on the value. Values from the data set corresponding to the first category are stored in multiple quadrants of the point quadtree data structure. The determination of whether a value corresponds to the first category and should be added to a particular quadrant is performed by one or more of the qubits corresponding to the particular quadrant.

In another example embodiment of the above described quantum computer, during a first phase, the determination is performed for a plurality of values from a first portion of the data set based on comparison of the values to the criteria, and during a second phase that is subsequent to the first phase, the determination is performed for a plurality of values from a second portion of the data set that is different from the first portion based on the statistical distribution.

In another example embodiment of any of the above described quantum computers, the quadrant in which a given value is stored in the point quadtree data structure is based on which portion of the data set the value was obtained from.

One example embodiment of a computing device includes memory and a processing circuit operatively connected to the memory and configured to: obtain a data set and criteria for determining whether individual values from the data set correspond to a first category or a second category of values, determine whether values of the data set correspond to the first category or the second category, and based on one of the values corresponding to the first category, add the value to a compressed data set. The processing circuitry is configured to, based on one of the values corresponding to the second category, exclude the value from the compressed data set, and update a statistical distribution of values of the second category in the data set based on the value. During a first phase, the determination is performed for a plurality of first values from a first portion of the data set based on comparison of the values to the criteria. During a second phase that is subsequent to the first phase, the determination for a plurality of second values from a second portion of the data set that is different from the first portion is performed based on the statistical distribution.

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

BRIEF DESCRIPTION OF THE DRAWINGS

FIG. 4 is a schematic view of a portion of another uncompressed data set.

DETAILED DESCRIPTION

Figures 1, 2A, 2B:
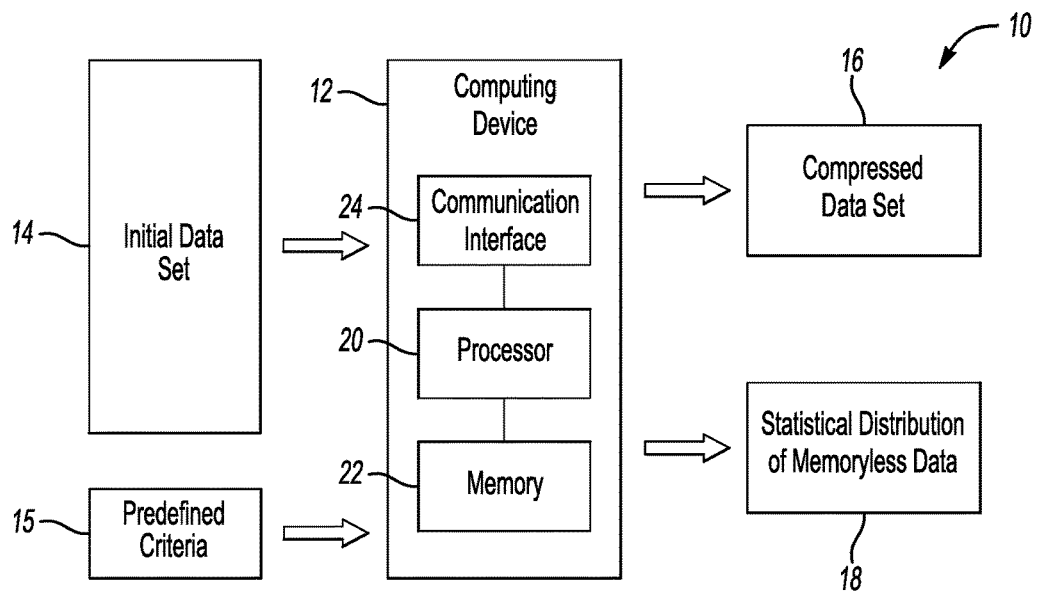
FIG. 1 is a schematic view of an example system for compressing data.
FIG. 2A is a schematic view of a portion of an uncompressed data set.
FIG. 2B is a schematic view the portion of FIG. 2A in a compressed form.

FIG. 1 is a schematic view of an example system 10 for compressing data in a computationally efficient manner which avoids scrubbing of relevant data. A computing device 12 accesses an initial data set 14, which may be on the order of 100s of terabytes in size. The computing device 12 iteratively analyzes the data in separate phases, and provides a compressed data set 16 that includes data that is relevant to the purpose of the data set 14, and also provides a statistical distribution 18 of "memoryless" data, which is part of the data set 14 but is not relevant to the purpose of the data set 14.

In one example, the data set 14 includes particle accelerator measurements from a particle accelerator device. In such an example, the data that is considered relevant in the context of the data set provides useful information about particles (e.g., information such as the speed of the particle, lightness in terms of weight in the subatomic scale, as well as the closest accurate position of magnetic lattice of a particle accelerator as it is measuring the particles), and data that is considered not relevant and does not provide useful information about particles corresponds to the second category. The first category of values, in addition to being more relevant than the second category of values, are also more complex than the first category of values, and may therefore be referred to as "complexities."

During a first phase, the computing device 12 compares values from the data set 14 to predefined criteria 15 to determine whether those values from the data set 14 correspond to a first category or second category. The first phase is a training phase during which the computing device 12 creates the statistical distribution 18 of memoryless data. The statistical distribution 18 indicates values from the data set 14 that are memoryless data, and also indicates how often those values appear in the data set.

In a second phase that is subsequent to the first phase, the computing device 12 determines whether values from the data set 14 correspond to the first or second category by comparing the values to the statistical distribution 18 instead of comparing the values to the predefined criteria 15. Comparison against the statistical distribution during the second phase is more computationally efficient than using the criteria of the first phase, and facilitates creation of the compressed data set 16 much more quickly than if the first phase were to be continued for the entire data set 14.

The computing device 12 includes a processor 20 operatively connected to memory 22 and a communication interface 24. In one example, the processor 20 includes one or more microprocessors, microcontrollers, application specific integrated circuits (ASICs), quantum computing processors, or the like, for example. The memory 22, which can include any one or combination of volatile memory elements (e.g., random access memory (RAM, such as DRAM, SRAM, SDRAM, VRAM, etc.)) and/or nonvolatile memory elements (e.g., ROM, hard drive, tape, CD-ROM, etc.). Moreover, the memory 22 may incorporate electronic, magnetic, optical, and/or other types of storage media. The memory 22 can also have a distributed architecture, where various components are situated remotely from one another, but can be accessed by the processor 20. The memory 22 stores instructions that configure the processor 20 to compress the data set 14.

The communication interface 24 is configured to facilitate communication with other computing devices (e.g., for obtaining the data set 14 and predefined criteria 15, or transmitting the compressed data set 16) and/or with user input devices (e.g., if the communication interface 224 includes a wired or wireless interface for receiving and/or providing user input).

FIG. 2A depicts a portion 30 of an example the data set 14 that includes a plurality of values generically identified with reference numeral 31. The portion 30 of FIG. 2A corresponds to particle accelerator data gathered from a particle accelerator device. The predefined criteria 15 for data set 14 indicates which values correspond to the first category or second category.

In the particle accelerator example of FIG. 2A, the predefined criteria 15 indicates that zero or non-zero integers are memoryless data that correspond to the second category of values. The reason for such values being considered memoryless is that such values are irrelevant in the context of particle accelerators.

The predefined criteria indicates that the following values, which are "complexities" that are relevant in the context of particle accelerators, correspond to the first category of values:
   irrational numbers (i.e., numbers that cannot be expressed as a fraction of any integers and have non-terminating decimal expansions),
   complex numbers (i.e., numbers that can be expressed in the form a+bi, where a and b are real numbers, and i is a solution of the equation $x^2=-1$),
   mixed hashes, (i.e., values having both numeric and alphabetic characters, such as "1e42"), and
   values having a non-zero decimal value at or beyond an Xth decimal place, where X is a predefined value.

In the context of a particular accelerator, zeros represent data that is useless or just filler data that can be removed since it isn't an actual point of measurement. The complexities described above, however, are relevant in the context of particle accelerators because they can represent the following:
   Irrational numbers can represent further measurements for a particle that is best seen by fractions or non-terminating decimal expansions.
   Complex numbers can represent the polar position of a particle or important unknown that is better mathematically represented through a complex form (e.g., unknowns such as certain possible outcomes for the weight of some subatomic particles, or data that is still useful but needs a complex expressed from to represent).
   Mixed hashes can represent the position of a magnetic lattice for the particle accelerator while it is measuring.
   Values that have non-zero decimal values or a continuing decimal point useful after a certain place (e.g., on the order of 14 decimal places) represent a more accurate form of measurements given the closeness of its significant figure for what you are trying to measure whether polar position or speed.

Using this criteria in the context of FIG. 2, the first complexity (32) is the value $8979^{-3}$ as this value has a non-zero decimal value at or beyond an Xth decimal place, where X is 14. The second complexity (34) is the cubed root of 253 which is a complexity for the same reason. The third complexity (36) is $39.05603e^7$ and is a complexity because values including e are considered irrational. The fourth complexity (38) "3e64" is a complexity because it is a mixed hash. This comparison of each value 31 to the criteria 15 proceeds to identify a plurality of complexities, shown in a compressed data set 50 of FIG. 2B that includes the complexities from data set 30 and excludes the memoryless data. The values from data set 30 that are omitted from the compressed data set 50 are either integers, or do not include a non-zero decimal value at or beyond an Xth decimal place.

Unlike prior art tools, which would scrub complexities during compression, the system 10 maintains complexities in the compressed data set 16. This is particularly useful for data sets such as particle accelerator data, where complexities are the most relevant data.

Figure 3A:
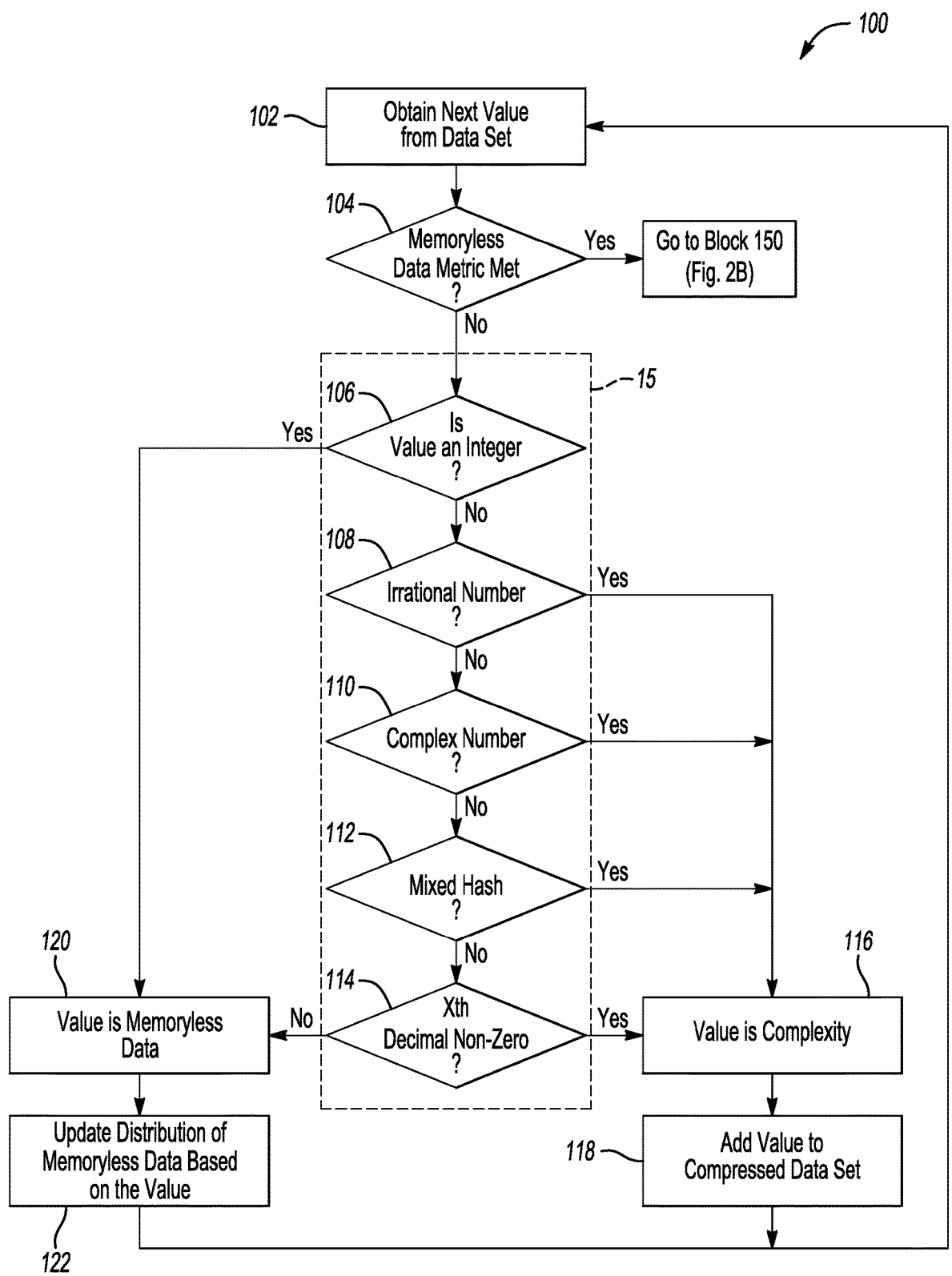
FIGS. 3A-B illustrate a flowchart representative of an example data compression method.
Figure 3B:
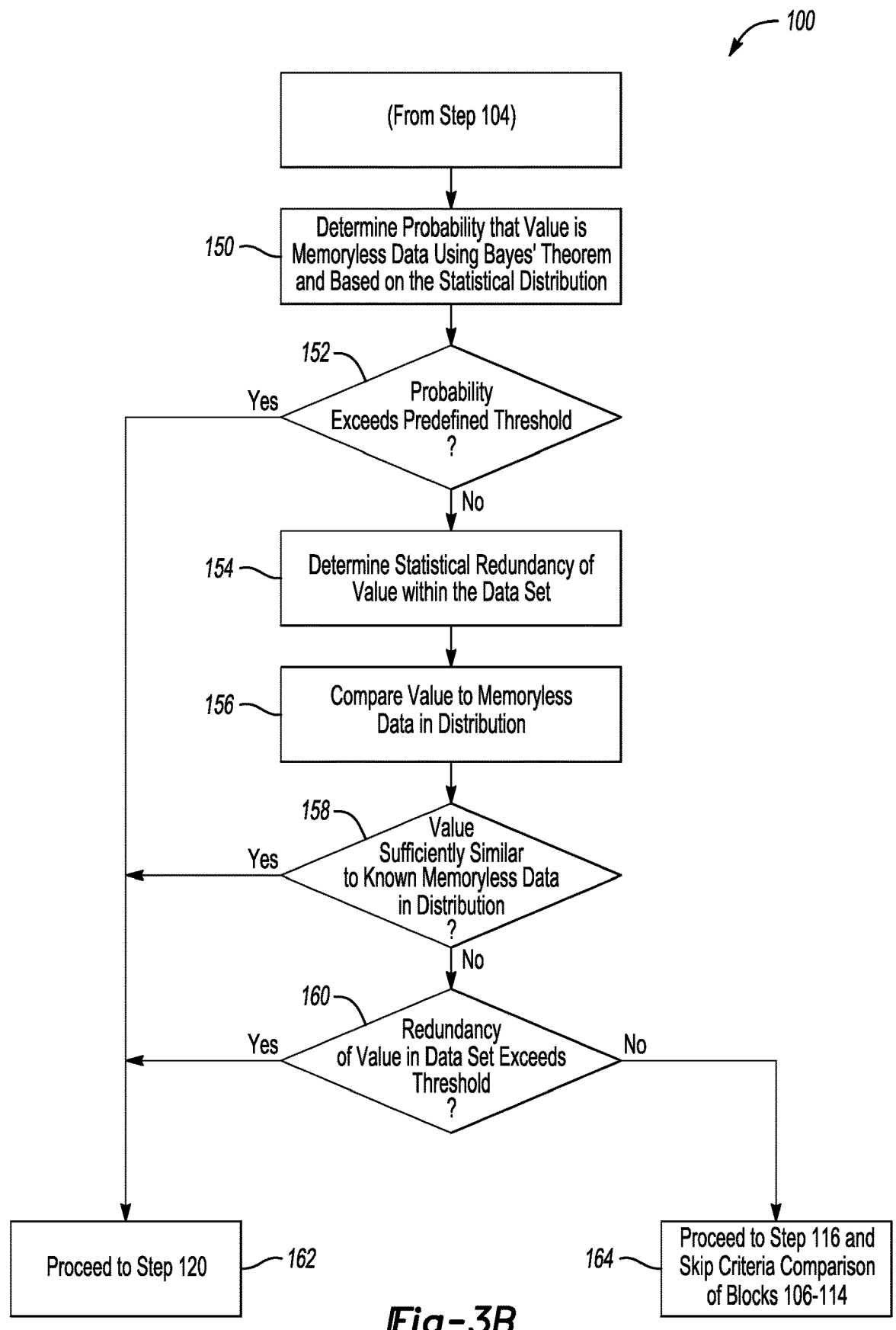

FIGS. 3A and 3B are flow charts illustrative of an example method 100 for data compression that may be performed by the computing device 12. A value is obtained from the data set 14 (block 102), and a determination is made of whether a memoryless data metric has been met (block 104). The memoryless data metric will be discussed in greater detail below. During the "first phase" discussed above, the metric will not have been met (a "no" to block 104).

Blocks 106-114 correspond to comparison of the value against the predefined criteria 15. A determination is made whether the obtained value is a zero or non-zero integer (e.g., a zero or non-zero integer) (block 106). If the value is an integer (a "yes" to block 106) the value is determined to be memoryless data (block 120), and the statistical distribution 18 of memoryless data is updated based on the value (block 122). The updating of block 122 includes adding the value to the statistical distribution 18 if it is not already present in the statistical distribution 18. If the value is already present in the statistical distribution 18, the statistical distribution is updated to indicate that another occurrence of the value has been detected. In one example, memoryless data is stored in the statistical distribution 18 in the "regular expression" (REGEX) format.

Referring again to block 106, if the value is not an integer (a "no" to block 106) a determination is made of whether the value is an irrational number (block 108). If the value is an irrational number (a "yes" to block 108), the value is determined to be a complexity (block 116), and the value is added to the compressed data set 16 (block 118).

If the value is not an irrational number (a "no" to block 108), a determination is made of whether the value is a complex number (block 110). If the value is a complex number (a "yes" to block 110), the value is determined to be a complexity (block 116), and is added to the compressed data set 16 (block 118).

Otherwise, if the value is determined to not be a complex number (a "no" to block 110), a determination is made of whether the value is a mixed hash (block 112). If the value is a mixed hash that includes both numeric and alphabetic characters (a "yes" to block 112), the value is determined to be a complexity (block 116) and is added to the compressed data set 16 (block 118).

Otherwise, if the value is not a mixed hash (a "no" to block 112), a determination is made of whether the value has a non-zero decimal value at or beyond an Xth decimal place, where X is a predefined value (block 114). If a non-zero decimal value is present at or beyond the Xth decimal place (a "yes" to block 114), the value is determined to be a complexity (block 116). Otherwise, if the value lacks a non-zero decimal value at or beyond an Xth decimal place (a "no" to block 114), the value is determined to be memoryless data (block 120). In one example, X is 10. In a further example, X is 14. Of course, other examples could be used for X (e.g., depending on the nature of the data set 14 being analyzed).

The computing device 12 iterates through blocks 102-122 of the method for successive values from the data set 14 until the memoryless data metric is met (a "yes" to block 104). In one example the memoryless metric includes a predefined quantity of consecutive iterations of being performed with no new values being added to the statistical distribution 18. In one example, the memoryless data matrix is met if a predefined portion of the data set 14 has been analyzed (e.g. a predefined percentage of the data set). Of course, other memoryless data metrics can be used. Occurrence of the memoryless data metric corresponds to the statistical distribution 18 of memoryless data being suitable for use in determining whether values are complexities or memoryless data.

Once the memoryless data metric has been met (a "yes" to block 104), the method 100 enters the "second phase" discussed above and proceeds to block 150 in FIG. 3B.

Referring now to FIG. 3B, in block 150 a probability that the value of the current iteration is memoryless data is determined based on the statistical distribution 18 using Bayes' Theorem.

Bayes' theorem describes the probability of an event based on prior knowledge of conditions that might be related to the event, and can be represented using equations (1) and (2) below.

$$P(\theta, y) = P(\theta)P(y \mid \theta) \qquad \text{equation (1)}$$

$$P(\theta, y) = \frac{P(\theta, y)}{P(y)} = \frac{P(y \mid \theta)P(\theta)}{P(y)} \qquad \text{equation (2)}$$

where P is a probability,
y is evidence (e.g., the statistical distribution 18), and
θ is an event (e.g., a value being memoryless data).

The probability is compared to a predefined threshold in block 152. If the probability exceeds the predefined threshold (a "yes" to block 152), the computing device 12 determines that the value is memoryless data and proceeds to block 120 without utilizing the predefined criteria 15 of blocks 106-114.

If the probability is not exceeded (a "no" to block 152), the computing device 12 determines a statistical redundancy of the value within the data set 14 (block 154). One way of determining statistical redundancy is using equation (3) below.

$$r = \lim_{n \to \infty} \frac{1}{n} H(M_1, M_2, \ldots M_n) \qquad \text{equation (3)}$$

where r is a rate of redundancy,
M is a value of memoryless data, and
H is a source (e.g., data set 14).

The computing device 12 compares the value to memoryless data in the statistical distribution 18 (block 156). If the value is sufficiently similar to known memoryless data in the distribution (a "yes" to block 158), the value is determined to be memoryless data (block 162).

The comparison of block 156 and determination of block 158 could be based on a number of factors such as quantity of decimal values, placement of decimal values, difference between a value being analyzed and known memoryless data value, etc.

For example, assume the value 9.07899 is being compared to the statistical distribution 18 in block 156. We know from the example of FIGS. 3A-B, that 9.07898 was determined to be memoryless data and was excluded from the compressed data set 50. The value 9.07899 has a same quantity and same placement of decimal values as the known memoryless data 9.07898. The values only differ in their $5^{th}$ decimal value. In one example, one or more of those similarities is used to determine that the value 9.07899 is memoryless data.

In one example, what happens in block 156 to 158 is since you have a measurement for similarity of prior examples in memoryless data, then as you proceed further, you can have a more statistically accurate measurement for the computing device 12 as it analyzes data. That means eventually the computing device 12, computer given the data set 14, can perform less steps since a statistically relevant threshold was created. With the method 100, it is readily achievable in some examples to get past Six Sigma accuracy given large data sets 14 after few complexities have been identified since you are increasing the statistical probability of accuracy complexity after complexity given what the computer does to computationally analyze the complexities during the second phase. The margin of error in identifying complexities is likely to be extremely low.

In some instances, the performance of blocks 156 and 158 will be more computationally intensive for values which are more complex than others and may be encountered well into a data set (e.g., after analyzing millions of values of a data set) and are less similar to existing complexities in the compressed data set 16 than previously analyzed complexities. For example, multiple probabilities may need to be determined using Bayes' theorem for such values. Nevertheless, the method 100 can still be used to determine whether such values are memoryless data or are complexities.

If the value is not sufficiently similar to known memoryless data (a "no" to block 158), then the statistical redundancy of block 154 is compared to a predefined threshold (block 160). If the statistical redundancy exceeds the threshold (a "yes" to block 160), the value is determined to be memoryless data (block 162). Otherwise, if the statistical redundancy does not exceed the threshold (a "no" to block 160), the value is determined to be a complexity (block 164).

Although FIGS. 3A-B have been discussed in the context of compressing particle accelerator data, it is understood that the same or similar criteria from blocks 106-114 could be used to analyze other types of data, such as cancer genomics data.

FIG. 4 is a schematic view of a portion of another uncompressed data set 60 containing cancer genomics data. Each of the values 62 that is encircled in a box represents a complexity according to the predefined criteria 15 discussed in blocks 106-114 of FIG. 3A.

Of course, it is understood that other types and quantities of criteria could be used for blocks 106-114 for analyzing different data sets, and that different thresholds and similarity levels could be used for blocks 152, 158, 160 for those different data sets as well. Some examples of other data sets that could be analyzed using the method 100 (optionally with different criteria and thresholds) include ecological data sets (e.g., plant growth, degree of loss of habitat, animal reproduction rates, etc.), financial data (e.g., stock time series charts), scouting charts for a sporting events, etc.

In one example the compressed data set 16 is stored in a quadtree data structure. In a further example, the compressed data set is stored in a point quadtree data structure.

Figure 5:
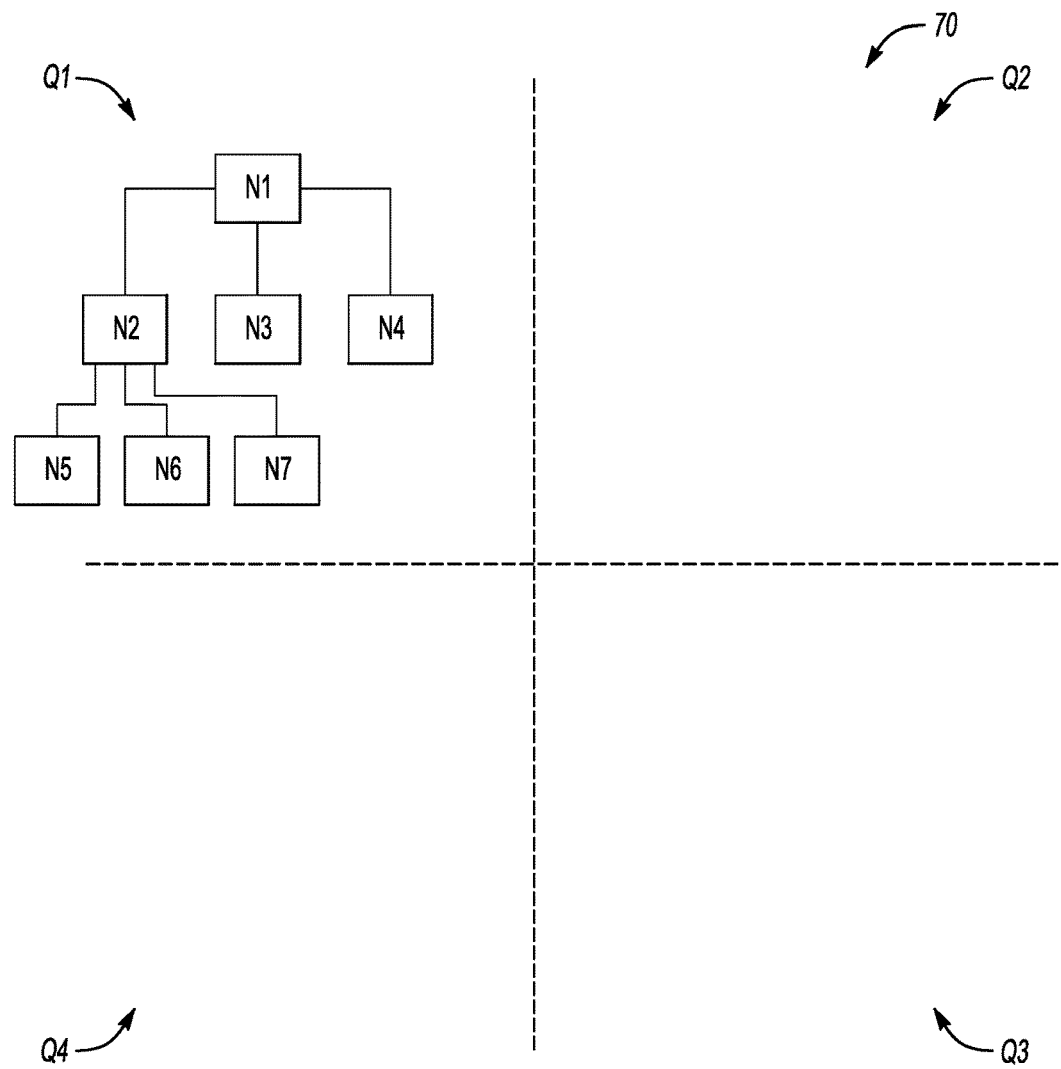
FIG. 5 is a schematic view of an example point quad tree data structure.

FIG. 5 is a schematic view of an example point quadtree data structure 70 that is simplified for explanatory purposes. The point quadtree data structure includes a plurality of quadrants Q1, Q2, Q3, Q4. In one example, each value in the compressed data set 16 is stored in a particular one of the quadrants.

In one example, the quadrant in which a given value is stored in the point quadtree data structure 70 is based on which portion of the data set 14 the value was obtained from. In one example, values from a first portion of the data set 14 are stored in quadrant Q1, values from a second portion of the data set 14 are stored in quadrant Q2, values from a third portion of the data set 14 are stored in quadrant Q3, and values from a fourth portion of the data set 14 are stored in quadrant Q4.

In one example, values from the first phase (before the memoryless data metric of block 104 is met) are stored in quadrant Q1, and values from the second phase (after the memoryless data metric of block 104 is met) are stored in quadrants Q2-Q4.

Each value in the quadtree is connected to one or more other values in its respective quadrant in a hierarchical fashion. In the simplified example of FIG. 5, a plurality of example values are represented in quadrant Q1 as nodes N1-N7. Node N1 is linked to nodes N2-N4, and node N4 is linked to nodes N5-N7. As more values (and corresponding nodes) are added to the point quadtree data structure 70, they are linked to other values from the compressed data set 16. A point quadtree is useful for the computing device 12 to plot nodes and create a data structure that utilizes a the zeta function verification process (discussed in greater detail below). Overall if one was to map out the compressed data set 16 using a traditional table instead of a point quadtree, it would be less useful given the continuing hierarchal nature of the second phase of the method 100.

Optionally, a data verification process can be performed by the computing device 12 to verify that memoryless data did not inadvertently get added to the compressed data set 16 during the second phase. In one example, this is performed by comparing each piece of data from the compressed data set against the predefined criteria 15 for the data set to verify that each value in the compressed data set 16 satisfies the predefined criteria 15.

In one example, the verification includes verifying that memoryless data is not present in the compressed data set 16 based on the Riemann zeta function. The Riemann zeta function is a function of a complex number s that satisfies equations (4) and (5) below.

$$s = x + iy \text{ and} \qquad \text{equation (4)}$$

$$i = \sqrt{-1} \qquad \text{equation (5)}$$

The Riemann zeta function can also be represented using equation (6) below.

$$\vartheta(s) = 1 + \frac{1}{2^s} + \frac{1}{3^s} + \frac{1}{4^s} + \frac{1}{5^s} + \ldots \qquad \text{equation (6)}$$

Yet another way the Riemann zeta function can be represented is using equation (7) below, in which only prime numbers are raised to the power of S in the denominator.

$$\vartheta(s) = \frac{1}{\left(1 - \frac{1}{2^s}\right)\left(1 - \frac{1}{3^s}\right)\left(\frac{1}{5^s}\right)\left(\frac{1}{7^s}\right)\left(\frac{1}{11^s}\right)\ldots} \qquad \text{equation (7)}$$

Figure 6:
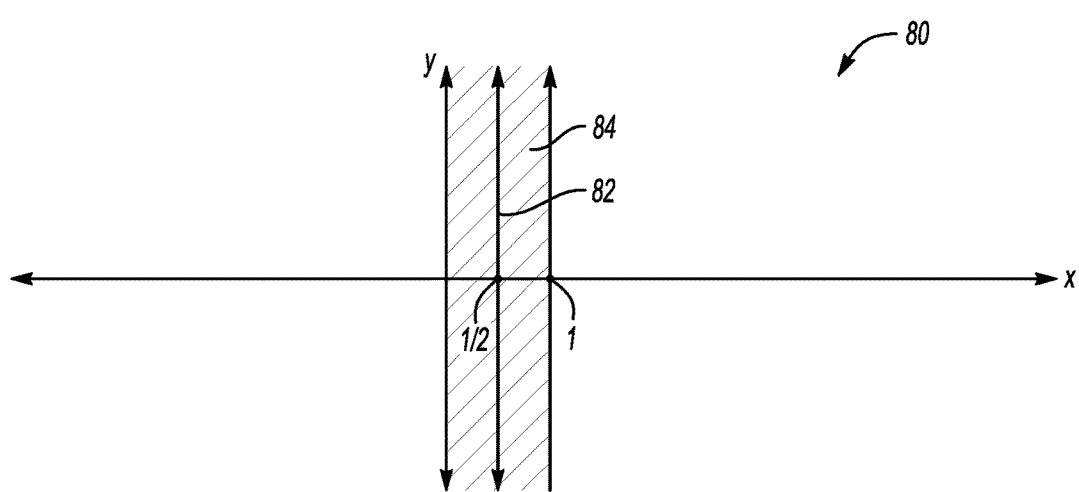
FIG. 6 is a schematic view of an aspect of the Riemann zeta function.

Referring now to FIG. 6, a graph 80 is shown which depicts x and y axes, and a symmetry line 82 of the Riemann zeta function. The symmetry line 82 is also known as the "critical line" and it is present in a "critical strip" 84 of the Riemann zeta function (shaded area between 0 and 1 on the x axis). It is believed that all values at which the Riemann zeta function has the value of zero lie on the critical line 82. Certain values from the compressed data set 16, such as complex and irrational numbers, will yield values in the critical strip 84.

In one example, the verification includes determining a subset of values in the compressed data set 16 that reside within the critical strip 84 of the Riemann zeta function, verifying whether that subset of values satisfy the predefined criteria 15, and based on any values from the subset not satisfying the criteria, determining that those values are likely to be memoryless data and excluding the those values from the compressed data set 16.

Figure 7:
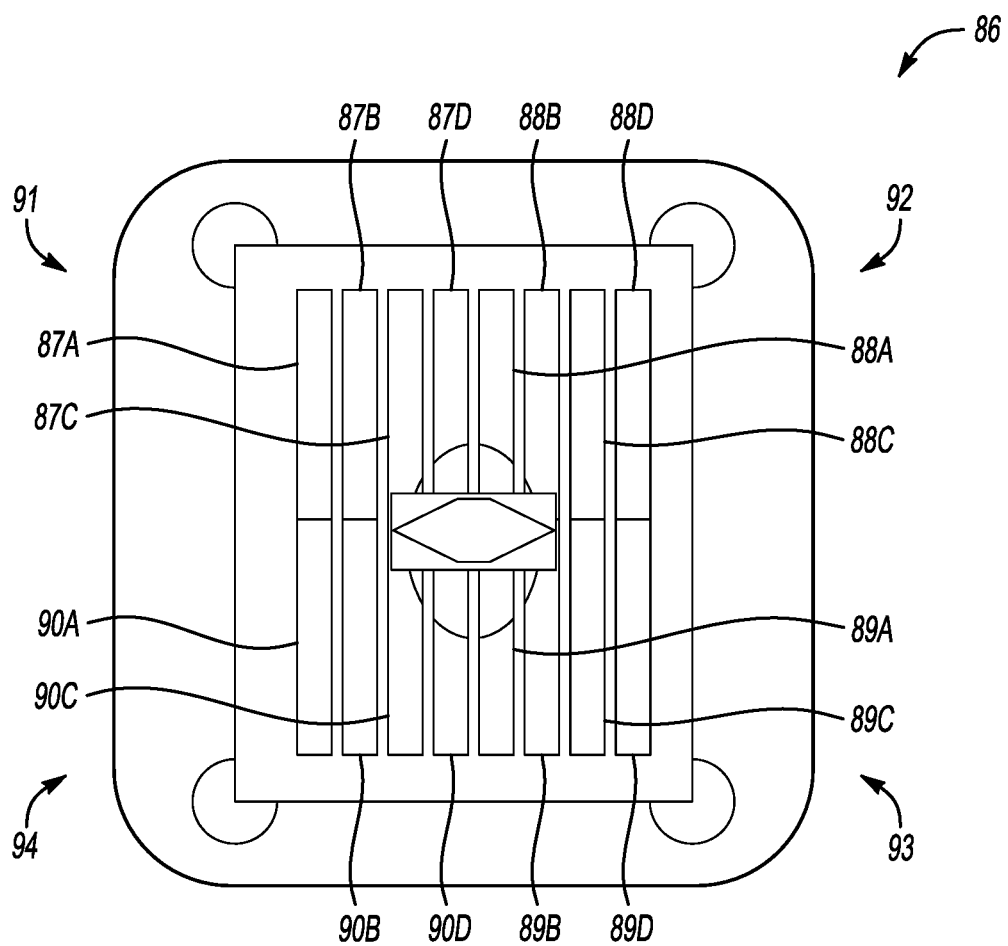
FIG. 7 is a schematic view of a quantum computing processor operable to perform the method of FIGS. 2A-B.

FIG. 7 is a schematic view of a quantum computing processor 86 operable to perform the method 100. The quantum computing processor 86 includes a plurality of qubits depicted schematically as 87A-D, 88A-D, 89A-D, 90A-D. Each qubit a multi-state quantum-mechanical system that can represent information using quantum mechanics (e.g., the spin of an electron, the polarization of a photon, etc.). Each group of qubits is provided in a particular region of the quantum computing processor 86. In particular, qubits 87A-D are provided in an upper left region 91, qubits 88A-D are provided in an upper right region 92, qubits 89A-D are provided in a lower right region 93, and qubits 90A-D are provided in a lower left region 94.

In one example, the regions are correlated to the quadrants of the point quadtree data structure 70 (e.g., region 91 as quadrant Q1, region 92 as quadrant Q2, region 93 as quadrant Q3, and region 94 as quadrant Q4). In one such example, the determination of whether a value from the data set 14 corresponds is a complexity and should be added to a particular quadrant is performed by one or more of the qubits corresponding to that particular quadrant. Thus, the determination of whether a value is a complexity and should be added to quadrant Q1 is performed by one or more of the qubits 87A-D.

By using the techniques described herein, large data sets can be compressed while ensuring that complexities are not scrubbed from the compressed data set. This is particularly beneficial for certain data sets in which complexities are the primary data of interest (e.g., particle accelerator data sets, cancer genomics data sets, etc.). Also, by using the statistical distribution 18 and machine learning described above, the data set 14 can be compressed in a computationally efficient manner The method 100 provides a number of benefits, such as improved file compression, and the ability to view the important complexities of a data set 14. This enables a researcher to obtain the important data they want, come up with a conclusion much faster, and have a more efficient way to systematically analyze enormous data sets. In comparison to using Python programs such as GGPLOT or what is already commercially available, the time efficiency of the method 100 enables one to avoid plotting/analyzing useless and/or arbitrary data, providing a savings in time and computational resources.

Although the steps discussed above are presented in a particular order, it is understood that some of the steps could be rearranged. For example, the criteria of blocks 106-114 could be analyzed in a different order.

Although example embodiments have been disclosed, a worker of ordinary skill in this art would recognize that certain modifications would come within the scope of this disclosure. For that reason, the following claims should be studied to determine the scope and content of this disclosure.

What is claimed is:

1. A method of compressing a data set, comprising:
    obtaining a data set and criteria for determining whether individual values from the data set correspond to a first category or a second category of values;
    determining that some values of the data set correspond to the first category, and that other values of the data set correspond to the second category;
    based on one of the values corresponding to the first category, adding the value to a compressed data set; and
    based on one of the values corresponding to the second category:
        excluding the value from the compressed data set; and
        updating a statistical distribution of values of the second category in the data set based on the value;
    wherein during a first phase, the determining is performed for a plurality of values from a first portion of the data set based on comparison of the values to the criteria; and
    wherein during a second phase that is subsequent to the first phase, the determining is performed for a plurality of values from a second portion of the data set that is different from the first portion based on the statistical distribution.

2. The method of claim 1, wherein values corresponding to the first category of data are more complex than values corresponding to the second category of data.

3. The method of claim 1, comprising during the second phase:
    determining a probability that a particular value from the second portion of the data set corresponds to the second category based on the statistical distribution; and
    determining that the particular value corresponds to the second category based on the probability exceeding a predefined threshold.

4. The method of claim 3, wherein said determining a probability that a particular value from the second portion of the data set corresponds to the second category based on the statistical distribution is performed based on Bayes' theorem.

5. The method of claim 1, wherein said second phase is initiated in response to a trigger event.

6. The method of claim 5, wherein:
    each determination corresponds to an iteration;
    a value from the data set is only added to the statistical distribution based on the value not already being present in the statistical distribution; and
    the trigger event comprises no values from the first portion of the data set being added to the statistical distribution for a predefined quantity of consecutive iterations.

7. The method of claim 5, wherein the trigger event comprises completion of said determining for a predefined portion of the data set.

8. The method of claim 1, wherein during the first phase, determining whether a value of the data set corresponds to the first category or the second category comprises determining that the value corresponds to the first category based on the value being an irrational number.

9. The method of claim 1, wherein during the first phase, determining whether a value of the data set corresponds to the first category or the second category comprises determining that the value corresponds to the first category based on the value being a complex number.

10. The method of claim 1, wherein during the first phase, determining whether a value of the data set corresponds to the first category or the second category comprises determining that the value corresponds to the first category based on the value being a mixed hash that includes both numeric and alphabetical characters.

11. The method of claim 1, wherein during the first phase, determining whether a value of the data set corresponds to the first category or the second category comprises determining that the value corresponds to the first category based on the value including a non-zero decimal value at or beyond an Xth decimal place, where X is a predefined value that is greater than nine.

12. The method of claim 1, wherein during the first phase, determining whether a value of the data set corresponds to the first category or the second category comprises determining that the value corresponds to the second category based on the value being an integer.

13. The method of claim 1, wherein said updating a statistical distribution of values of the second category in the data set based on the value comprises:
adding the value to the statistical distribution based on the value not already being present in the statistical distribution; and
updating the statistical distribution to reflect a quantity of times the value has been found in the data set based on the value already being in the statistical distribution.

14. The method of claim 1, comprising during the second phase:
determining a redundancy of a particular value from the second portion of the data set within the data set; and
determining that the particular value corresponds to the second category based on the redundancy exceeding a predefined threshold.

15. The method of claim 1, wherein the compressed data set is stored in a quadtree data structure.

16. The method of claim 15, wherein the quadtree data structure is a point quadtree data structure.

17. The method of claim 15, wherein:
values determined to correspond to the first category during first phase are stored in a first quadrant of the quadtree data structure; and
values determined to correspond to the first category during the second phase are stored in one or more other quadrants of the quadtree data structure that are different from the first quadrant.

18. The method of claim 17, wherein the quadrant in which a given value is stored in the point quadtree data structure is based on which portion of the data set the value was obtained from.

19. The method of claim 15, wherein:
the quadtree data structure includes four quadrants;
a quantum computing processor includes a plurality of qubits, each corresponding to one of the quadrants; and
the determination of whether a value corresponds to the first category and should be added to a particular quadrant is performed by one or more of the qubits corresponding to the particular quadrant.

20. The method of claim 1, comprising:
verifying that values corresponding to the second category are not present in the compressed data set based on the Riemann zeta function.

21. The method of claim 20, wherein said verifying that values corresponding to the second category are not present in the compressed data set based on the Riemann zeta function comprises:
determining a subset of values in the compressed data set that reside within a critical strip of the Riemann zeta function;
verifying whether the subset of values satisfy the criteria; and
based on a value from the subset not satisfying the criteria, excluding the value from the compressed data set.

22. A quantum computer comprising:
processing circuitry including a quantum processor having a plurality of qubits divided into four groups, each group corresponding to a quadrant of a point quadtree data structure; the processing circuitry configured to:
obtain a data set and criteria for determining whether individual values from the data set correspond to a first category or a second category of values;
determine that some values of the data set correspond to the first category, and that other values of the data set correspond to the second category;
based on one of the values corresponding to the first category, add the value to a compressed data set in the point quadtree data structure; and
based on one of the values corresponding to the second category:
exclude the value from the compressed data set; and
update a statistical distribution of values of the second category in the data set based on the value;
wherein values from the data set corresponding to the first category are stored in multiple quadrants of the point quadtree data structure; and
wherein the determination of whether a value corresponds to the first category and should be added to a particular quadrant is performed by one or more of the qubits corresponding to the particular quadrant.

23. The quantum computer of claim 22, wherein:
during a first phase, the determination is performed for a plurality of values from a first portion of the data set based on comparison of the values to the criteria, and
during a second phase that is subsequent to the first phase, the determination is performed for a plurality of values from a second portion of the data set that is different from the first portion based on the statistical distribution.

24. The quantum computer of claim 22, wherein the quadrant in which a given value is stored in the point quadtree data structure is based on which portion of the data set the value was obtained from.

25. A computing device comprising
memory; and
a processing circuit operatively connected to the memory and configured to:
obtain a data set and criteria for determining whether individual values from the data set correspond to a first category or a second category of vales;
determine that some values of the data set correspond to the first category, and that other values of the data set correspond to the second category;
based on one of the values corresponding to the first category, add the value to a compressed data set; and
based on one of the values corresponding to the second category:
exclude the value from the compressed data set; and
update a statistical distribution of values of the second category in the data set based on the value;
wherein during a first phase, the determination is performed for a plurality of first values from a first portion of the data set based on comparison of the values to the criteria; and
wherein during a second phase that is subsequent to the first phase, the determination for a plurality of second values from a second portion of the data set that is different from the first portion is performed based on the statistical distribution.

* * * * *